United States Patent
Shin et al.

(10) Patent No.: US 9,531,378 B1
(45) Date of Patent: Dec. 27, 2016

(54) METHOD AND APPARATUS FOR DRIVING A POWER DEVICE

(71) Applicants: TOYOTA MOTOR ENGINEERING & MANUFACTURING NORTH AMERICA, INC., Erlanger, KY (US); VIRGINIA TECH INTELLECTUAL PROPERTIES, INC., Blacksburg, VA (US)

(72) Inventors: Jongwon Shin, Blacksburg, VA (US); Chi-Ming Wang, Ann Arbor, MI (US); Khai Ngo, Blacksburg, VA (US)

(73) Assignees: Toyota Motor Engineering & Manufacturing North America, Inc., Erlanger, KY (US); VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 0 days.

(21) Appl. No.: 14/845,081

(22) Filed: Sep. 3, 2015

(51) Int. Cl.
*H03B 1/00* (2006.01)
*H03K 3/00* (2006.01)
*H03K 17/687* (2006.01)
*G05F 3/24* (2006.01)

(52) U.S. Cl.
CPC .............. *H03K 17/687* (2013.01); *G05F 3/24* (2013.01)

(58) Field of Classification Search
CPC ............ H03K 17/04126; H03K 17/063; H03K 19/00361; H03K 19/00384; H03K 5/12
USPC ........ 327/108–112, 427, 434, 437, 170–177; 326/82, 83, 87
See application file for complete search history.

(56) References Cited

U.S. PATENT DOCUMENTS

| | | | | |
|---|---|---|---|---|
| 5,177,374 A | * | 1/1993 | Carpenter | H03F 3/505 327/109 |
| 8,847,631 B2 | | 9/2014 | Tao et al. | |
| 2007/0007537 A1 | * | 1/2007 | Ogura | H01L 29/7828 257/77 |
| 2012/0069615 A1 | | 3/2012 | Tomioka | |
| 2013/0009672 A1 | * | 1/2013 | Olivo | H03K 17/163 327/109 |
| 2013/0107584 A1 | * | 5/2013 | Li | H02M 1/08 363/21.12 |
| 2014/0146576 A1 | | 5/2014 | Yang | |
| 2014/0369101 A1 | | 12/2014 | Nguyen | |

OTHER PUBLICATIONS

"How to Calculate the Voltage Across an Inductor", Learning about Electronics, Dec. 4, 2012, retrieved May 19, 2016, https://web.archive.org/web/20121204023524/http://www.learningaboutelectronics.com/Articles/How-to-calculate-the-voltage-across-an-inductor.*

(Continued)

*Primary Examiner* — Lincoln Donovan
*Assistant Examiner* — Thomas Skibinski
(74) *Attorney, Agent, or Firm* — Oblon, McClelland, Meier & Neustadt, L.L.P.

(57) ABSTRACT

Aspects of the disclosure provide a circuit for driving a power switch. The circuit includes a first circuit configured to provide a charging current to charge a control terminal of the power switch, a second circuit configured to provide a discharging current to discharge the control terminal of the power switch, and a control circuit configured to provide control signals to the first circuit and the second circuit to activate/deactivate the first circuit and the second circuit. At least one of the charging current and the discharging current ramps from a first level to a second level at a rate.

20 Claims, 4 Drawing Sheets

(56) References Cited

OTHER PUBLICATIONS

EiceDRIVER—Safe, 1 EDS—SRC Real-time adjustable gate current control IC 1 EDS20112SV Target datasheet.
Frank, W., Arens, A., & Hoerold, S. (May 2014). Real-time adjustable gate current control IC solves dv/dt problems in electric drives. In PCIM Europe 2014; International Exhibition and Conference for Power Electronics, Intelligent Motion, Renewable Energy and Energy Management; Proceedings of (pp. 1-7). VDE.
Eberle, W., Zhang, Z., Liu, Y. F., & Sen, P. C. (2008). A current source gate dryer achieving switching loss savings and gate energy recovery at 1-MHz. Power Electronics, IEEE Transactions on, 23(2), 678-691.

* cited by examiner

METHOD AND APPARATUS FOR DRIVING A POWER DEVICE

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

An electronic system may include a driver circuit to turn on/off a power switch to provide power to other components in the electronic system. In an example, U.S. Patent Application Publication 2013/0107584 discloses a driver circuit having a high side transistor and a low side transistor to drive a gate of a power transistor. The driver circuit adjusts the resistance of the high side transistor and the low side transistor of three distinct levels in a single switching cycle to reduce electromagnetic interference (EMI).

SUMMARY

Aspects of the disclosure provide a circuit for driving a power switch. The circuit includes a first circuit configured to provide a charging current to charge a control terminal of the power switch, a second circuit configured to provide a discharging current to discharge the control terminal of the power switch, and a control circuit configured to provide control signals to the first circuit and the second circuit to activate/deactivate the first circuit and the second circuit. At least one of the charging current and the discharging current ramps from a first level to a second level at a rate.

In an embodiment, the first circuit is configured to provide a pull-up current to pull up a voltage at a gate terminal of a metal-oxide-semiconductor field effect transistor (MOSFET) in the power switch to turn on the MOSFET. In an example, the power switch is implemented using a silicon carbide MOSFET.

According to an aspect of the disclosure, the first circuit is configured to provide a pull-up current ramping up from the first level to the second level at the rate as a function of an inductance of an inductive component. In an embodiment, the first circuit includes a current mirror configured to mirror a current flowing through the inductive component to generate the pull-up current. In an example, the first circuit includes a switch configured to couple the inductive component to the current mirror in response to one of the control signals from the control circuit. Further, the first circuit includes a diode configured to conduct a freewheel current of the inductive component when the inductive component is de-coupled from the current mirror.

Aspects of the disclosure provide a method for driving a power switch. The method includes activating a first circuit, generating, by the first circuit, a current ramping from a first level to a second level at a rate; and providing the current to a control terminal of the power switch to turn on/off the power switch.

Aspects of the disclosure provide an apparatus that includes a power switch and a driver circuit. The power switch is configured to be turned on/off by the driver circuit. The driver circuit includes a first circuit configured to provide a charging current to charge a control terminal of the power switch, a second circuit configured to provide a discharging current to discharge the control terminal of the power switch, and a control circuit configured to provide control signals to the first circuit and the second circuit to activate/deactivate the first circuit and the second circuit. At least one of the charging current and the discharging current ramps from a first level to a second level at a rate.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
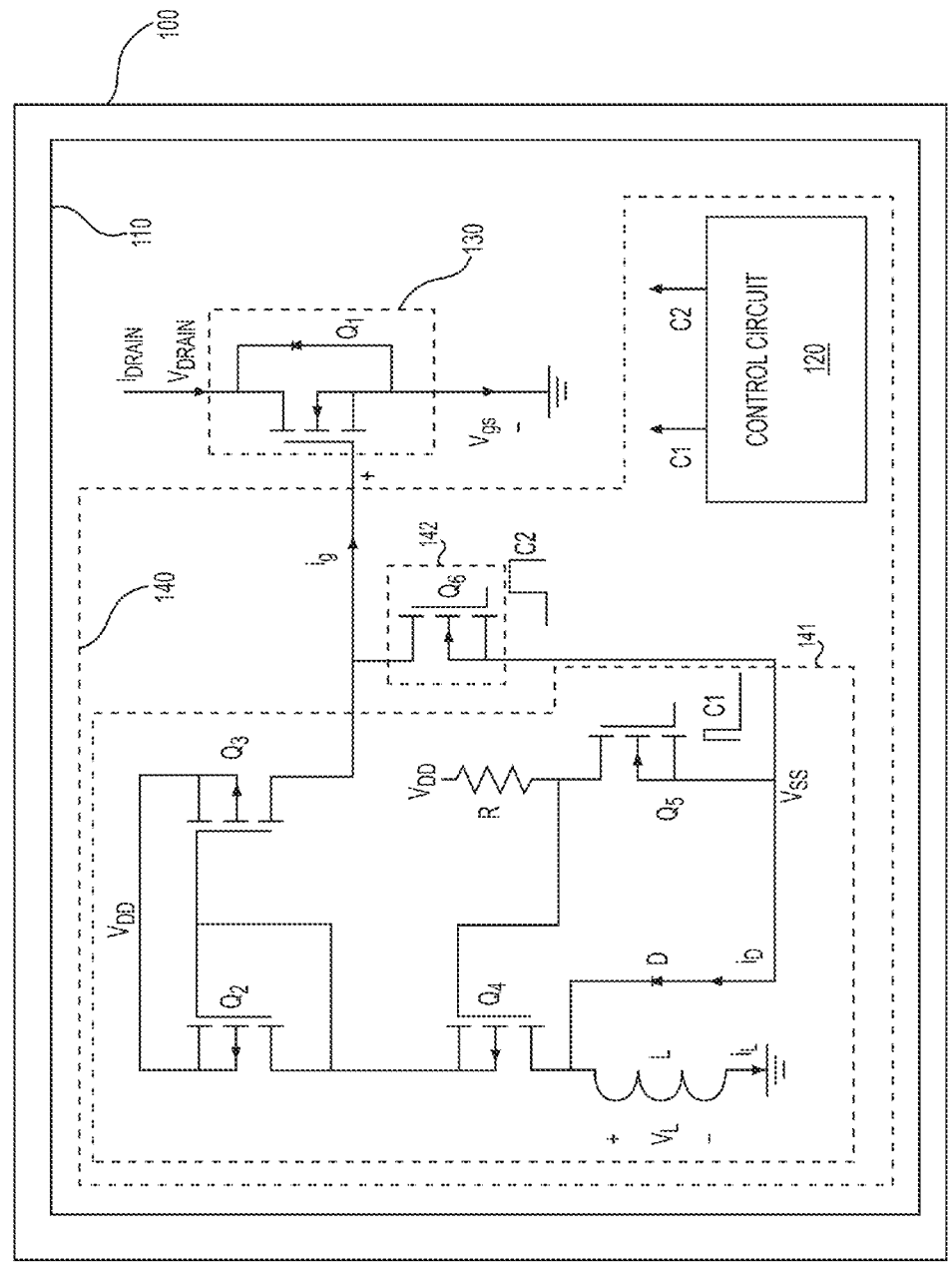
FIG. 1 shows a diagram of a system 100 according to an embodiment of the disclosure.

FIG. 1 shows a diagram of a system 100 according to an embodiment of the disclosure. The system 100 includes a power circuit 110 configured to provide energy to other components (not shown) in the system 100. The power circuit 110 includes a power switch 130, and a driver circuit 140 configured to turn on/off the power switch 130 to provide electric energy to the other components. The driver circuit 140 is configured to provide a driving current to a control terminal of the power switch 130 to charge/discharge the control terminal in order to turn on/off the power switch 130. The driving current has a controlled characteristic, for example, the driving current ramps from a first level to a second level at a specific rate. In an example, the driving current is provided based on a current flowing through an inductive component, such as an inductor L, and the like, and the rate is a function of the inductance of the inductive component.

The system 100 can be any suitable system. In an embodiment, the system 100 requires a relatively large power, such as a hybrid vehicle, an electric vehicle, a wind energy system, a printing system, and the like. During operation, in an example, the power circuit 110 needs to provide a relatively large current, such as in the order of Ampere and the like, to a load component.

In another embodiment, the system 100 is a low power system, such as a light emitting diode (LED) lighting system. During operation, the power circuit 110 is configured to perform power regulation to regulate electrical power from a power source, such as an AC source, a DC source, and the like, to be suitable for driving LEDs.

According to an aspect of the disclosure, the power switch 130 is implemented using one or more semiconductor switching devices. In the FIG. 1 example, the power switch 130 is implemented using an N-type metal oxide semiconductor field effect transistor (MOSFET) Q1. In an embodiment, the N-type MOSFET Q1 is implemented using silicon carbide (SiC) instead of silicon to improve performance for applications that require high temperature, high voltage, high frequency and the like. It is noted that the power switch 130 can be implemented using multiple transistors.

The N-type MOSFET Q1 has a gate terminal, a source terminal and a drain terminal. The N-type MOSFET Q1 is turned on/off in response to a gate voltage on the gate terminal. In an example, when the gate voltage is smaller than a threshold voltage, the N-type MOSFET Q1 is turned off not to conduct a drain current (e.g., $I_{DRAIN}$ is about zero)

between the drain terminal and the source terminal, and a voltage $V_{DS}$ across the drain terminal and the source terminal is about the voltage level of a power supply, such as $V_{DD}$. In the example, when the gate voltage increases and is larger than the threshold voltage, a channel starts to form between the drain terminal and the source terminal to conduct the drain current $I_{DRAIN}$, and the N-type MOSFET Q1 is turned on.

According to an aspect of the disclosure, the driving current provided to the gate terminal of the N-type MOSFET Q1 has a controlled ramping characteristic to reduce electromagnetic interference (EMI) generated by the N-type MOSFET Q1 and to ensure the N-type MOSFET Q1 having a fast switching speed, such as over 1 MHz, and the like. Generally, EMI noise is a function of the current change rate (dI/dt) of the drain current $I_{DRAIN}$ and the voltage change rate (dV/dt) of the drain-source voltage $V_{DS}$. In an example, when the driving current is provided without control, the current change rate of the drain current $I_{DRAIN}$ and the voltage change rate of the $V_{DS}$ can be large and the driving current can cause surge and ringing and can inject a large amount of EMI noise. In another example, when the driving current is controlled to have constant value, it may take a relatively longer time to raise the gate voltage, and thus the switching speed of the N-type MOSFET Q1 is affected and may not satisfy switching frequency requirement. In an embodiment, when the driving current ramps from a first level to a second level with a ramp rate, less harmonics of the driving current are injected into the system 100, ringing and surges can be reduced, the EMI noise generated by the N-type MOSFET Q1 can be reduced. Also, when the ramp rate is suitably determined and set, it takes less time for the driving current with the ramping characteristic to charge the gate terminal than the constant current, thus the switching speed requirement can be satisfied.

In the FIG. 1 example, the driver circuit 140 includes a pull-up circuit 141, a pull-down circuit 142, and a control circuit 120. The pull-up circuit 141 further includes P-type MOSFET Q2-Q4, and N-type MOSFET Q5, a resistor R, a diode D, and the inductor L with an inductance. The pull-down circuit 142 includes the N-type MOSFET Q6. These elements are coupled together as shown in FIG. 1.

The P-type MOSFET Q3 is coupled to the gate terminal of the N-type MOSFET Q1, and is configured to provide a pull-up current at a time to pull up the gate voltage at the gate terminal, and the N-type MOSFET Q6 is coupled to the gate terminal of the N-type MOSFET Q1 and is configured to provide a pull-down current at a time to pull down the gate voltage at the gate terminal.

The P-type MOSFET transistors Q2 and Q3 form a current mirror to provide the pull-up current based on the current flowing through the inductor L. The P-type MOSFET Q4 and the N-type MOSFET Q5 are configured to control the operation of the inductor L.

The control circuit 120 suitably generates control signals C1 and C2 to control the operation of the pull-up circuit 141 and the pull-down circuit 142. Specifically, the control signal C1 is provided to the gate terminal of the N-type MOSFET Q5, and the control signal C2 is provided to the gate terminal of the N-type MOSFET Q6. The control signals are suitably generated to turn on/off the N-type MOSFET Q1.

During operation, in an example, initially the N-type MOSFET Q1 is turned off. When the control signals C1 and C2 are logic "0" having a relatively low voltage, such as about the voltage level of ground, $V_{ss}$, and the like, the N-type MOSFET Q6 is turned off and provides no pull-down current, and the N-type MOSFET Q5 is turned off. When the N-type MOSFET Q5 is turned off, the drain terminal of the N-type MOSFET Q5 has a voltage level about the supply voltage $V_{DD}$, thus the gate terminal of the P-type MOSFET Q4 also has the voltage level about the supply voltage $V_{DD}$, then the P-type MOSFET Q4 is turned off. Further, because the P-type MOSFET Q4 is turned off, there is no current flowing in the P-type MOSFET Q2, and there is no current flowing in the P-type MOSFET Q3. Thus, the P-type MOSFET Q3 provides no pull-up current to the gate terminal of the N-type MOSFET Q1.

In an embodiment, to turn on the N-type MOSFET Q1, the control circuit 120 provides a positive pulse in the control signal C1 and keeps the control signal C2 at logic "0". When the control signal C2 is at logic "0", the N-type MOSFET Q6 is kept off not to provide pull-down current. When the control signal C1 changes from logic "0" to logic "1" of a relatively high voltage, such as about the voltage level of $V_{DD}$, the N-type MOSFET Q5 is turned on. When the N-type MOSFET Q5 is turned on, the voltage at the gate terminal of the P-type MOSFET Q4 is pulled down, and thus the P-type MOSFET Q4 is turned on. When the P-type MOSFET Q4 is turned on, current starts to flow in the inductor L and ramps up at a ramp-up rate. In an example, the inductor voltage $V_L$ is about the voltage level of the supple voltage $V_{DD}$, and the ramp up rate of the inductor current $i_L$ is a function of the inductor voltage $V_L$ and the inductance of the inductor L. The inductor current $i_L$ is mirrored by the current mirror formed of the P-type MOSFET Q2 and Q3 to provide the pull-up current to the gate terminal of the N-type MOSFET Q1.

The pull-up current charges up the gate terminal of the N-type MOSFET Q1, and causes the gate voltage to increase. When the gate voltage of the N-type MOSFET Q1 is higher than the threshold voltage for the N-type MOSFET Q1, the N-type MOSFET Q1 is turned on.

Further, when the control signal C1 changes from logic "1" to logic "0", the N-type MOSFET Q5 is turned off, the gate voltage of the P-type MOSFET Q4 is pulled up via the resistor R to the supply voltage $V_{DD}$, and the P-type MOSFET Q4 is turned off. When the P-type MOSFET Q4 is turned off, current stops flowing in the P-type MOSFET Q2, and the P-type MOSFET Q3 stops providing pull-up current to the gate terminal of the N-type MOSFET Q1, and the gate voltage on the gate terminal of the N-type MOSFET Q1 is maintained and keeps the N-type MOSFET Q1 turned on.

In addition, when the P-type MOSFET Q4 is turned off, the inductor voltage $V_L$ changes, and forward-biases the diode D, thus the inductor current $i_L$ ramps down via the diode D.

To turn off the N-type MOSFET Q1, the control circuit 120 provides a positive pulse in the control signal C2 and keeps the control signal C1 at logic "0". When the control signal C1 is at logic "0", the N-type MOSFET Q5 is turned off, and the P-type MOSFET Q3 provides no pull-up current to the gate terminal of the N-type MOSFET Q1. When the control signal C2 changes from logic "0" to logic "1" of a relatively high voltage, such as about the voltage level of $V_{DD}$, the N-type MOSFET Q6 is turned on to provide pull-down current to pull down the gate voltage of the N-type MOSFET Q1. When the gate voltage of the N-type MOSFET Q1 is lower than the threshold voltage of Q1, the N-type MOSFET Q1 is turned off.

In the FIG. 1 example, the pull-down current does not have the ramping characteristic. It is noted that, in another example, the pull down circuit 142 can be suitably modified according to the pull-up circuit 141 to provide the pull-down based on a current flowing through an inductor, such that the pull-down current has a ramping characteristic similar to the pull-up current.

In the FIG. 1 example, the driving current is provided and controlled according to the current flowing in the inductor L, thus the EMI noise generated by the N-type MOSFET Q1 is reduced compared to an example without current control. Further, the ramping rate can be suitably determined and set to satisfy a switching frequency requirement.

The control circuit 120 can be implemented using various technology. In an example, the control circuit 120 includes logic circuits for implementing control logics in an algorithm. In another example, the control circuit 120 is implemented as a processing circuit executing software instructions of the algorithm.

It is noted that the power circuit 110 can be implemented on a single integrated circuit (IC) chip, or multiple chips. In an example, the control circuit 120, N-type MOSFET Q5-Q6, and P-type MOSFET Q2-Q4 are integrated on an IC chip, the diode D, the inductor L, the resistor R, and the N-type MOSFET Q1 are implemented separately and are suitably coupled with the IC chip.

Figure 2:
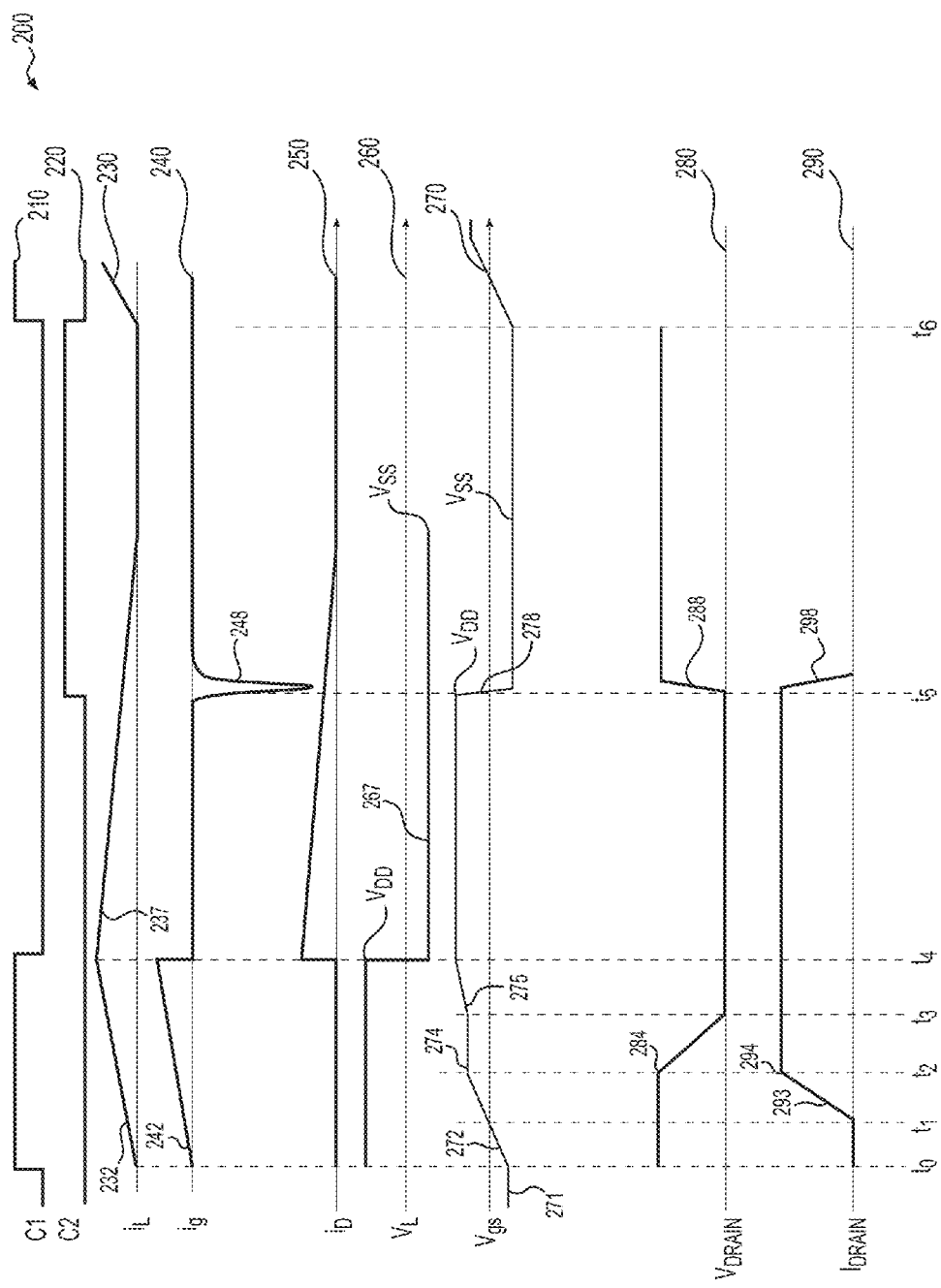
FIG. 2 shows a plot 200 of waveforms according to an embodiment of the disclosure.

FIG. 2 shows a plot 200 of waveforms for the system 100 according to an embodiment of the disclosure. The plot includes a first waveform 210 for the control signal C1, a second waveform 220 for the control signal C2, a third waveform 230 for the inductor current $i_L$, a fourth waveform 240 for the gate current $i_g$ of the N-type MOSFET Q1, a fifth waveform 250 for the diode current $i_D$ of the diode D, a sixth waveform 260 for the inductor voltage $V_L$, a seventh waveform 270 for the gate-source voltage $V_{gs}$ of the N-type MOSFET Q1, an eighth waveform 280 for the drain voltage $V_{DRAIN}$ of the N-type MOSFET Q1, and a ninth waveform 290 for the drain current $I_{DRAIN}$ of the N-type MOSFET Q1.

As shown in FIG. 2, initially, before time $t_0$, the gate-source voltage Vgs is lower than the threshold voltage as shown by 271, thus the N-type MOSFET Q1 is turned off, the drain current $I_{DRAIN}$ of the N-type MOSFET Q1 is about zero and the drain voltage $V_{DRAIN}$ is about $V_{DD}$.

At time $t_0$, the control circuit 120 changes the control signal C1 from logic "0" to logic "1". The control signal C1 is provided to the pull-up circuit 141 to turn on the N-type MOSFET Q5, and thus turn on the P-type MOSFET Q4. When the P-type MOSFET Q4 is turned on, current starts to flow in the inductor L, the inductor current $i_L$ ramps up, as shown by 232. Further, the inductor current $i_L$ is mirrored by the current mirror formed of the P-type MOSFET Q2 and Q3 to provide the gate current $i_g$ (as shown by 242) to charge the gate terminal and pull-up the gate voltage, and the gate-source voltage $V_{gs}$ increases, as shown by 272.

At time $t_1$, the gate-source voltage $V_{gs}$ is higher than the threshold voltage for the N-type MOSFET Q1, and the N-type MOSFET Q1 is turned on, a channel is formed between the drain terminal and the source terminal to conduct current, and the drain current $I_{DRAIN}$ starts to increase.

The gate terminal of the N-type MOSFET Q1 and the channel overlap and form a capacitor $C_{gs}$, and the gate current $i_g$ starts to charge the capacitor $C_{gs}$.

After $t_1$, the inductor current $i_L$ continues ramping up, the gate current $i_g$ continues ramping up and charges the capacitor $C_{gs}$, and the gate source voltage $V_{gs}$ continues to rise and the drain current $I_{DRAIN}$ rises as well as shown by 293.

At $t_2$, the capacitor $C_{gs}$ is fully charged and the drain current $I_{DRAIN}$ reaches a limit, for example, in saturation, thus the drain current $I_{DRAIN}$ stays relatively constant as shown by 294, and the drain voltage starts to drop as shown by 284. At this time, a capacitor $C_{gd}$ starts to form between the gate terminal and the source terminal of the N-type MOSFET Q1. The capacitor $C_{gs}$ is fully charged, the gate-source voltage $V_{gs}$ becomes relatively constant, as shown by 274, and the gate current $i_g$ starts to charge the capacitor $C_{gd}$.

At $t_3$, the drain voltage stops dropping, the capacitor $C_{gd}$ is fully charged, and the gate voltage $V_{gs}$ starts to rise again as shown by 275 until the gate voltage is about the voltage level of $V_{DD}$.

At $t_4$, the control circuit 120 changes the control signal C1 from logic "1" to logic "0". The control signal C1 is provided to the pull-up circuit 141 to turn off the N-type MOSFET Q5, and thus to turn off the P-type MOSFET Q4. When the P-type MOSFET Q4 is turned off, no current flows in the P-type MOSFET Q2, thus the P-type MOSFET Q3 stops providing the pull-up current, and the gate current $i_g$ drops to about zero. The gate voltage on the gate terminal of the N-type MOSFET Q1 is maintained and keeps the N-type MOSFET Q1 turned on. In addition, when the P-type MOSFET Q4 is turned off, the inductor voltage $V_L$ changes, for example from about $V_{DD}$ to about $V_{SS}$ as shown by 267, and the diode D is forward-biased to carry the free-wheeling current of the inductor L. The inductor current $i_L$ ramps down (as shown by 237) via the diode D.

At $t_5$, the control circuit 120 changes the control signal C2 from logic "0" to logic "1". The control signal C2 is provided to the pull-down circuit 142 to provide the pull-down current to the gate terminal of the N-type MOSFET Q1. Specifically, the N-type MOSFET Q6 is turned on to provide the pull-down current to pull down the gate voltage of the N-type MOSFET Q1. When the gate voltage of the N-type MOSFET Q1 is lower than the threshold voltage of Q1, the N-type MOSFET Q1 is turned off. In the FIG. 1 example, the pull-down current is not controlled and can increase very high in short time as shown by 248, and thus the drain current $I_{DRAIN}$ of the N-type MOSFET Q1 drops to zero in a relatively short time as shown by 298, and the drain voltage $V_{DRAIN}$ rises to $V_{DD}$ in a relatively short time as shown by 288.

It is noted that the FIG. 1 example can be suitably modified to control the pull-down current in a ramping characteristic similarly to the pull-up current.

Figure 3:
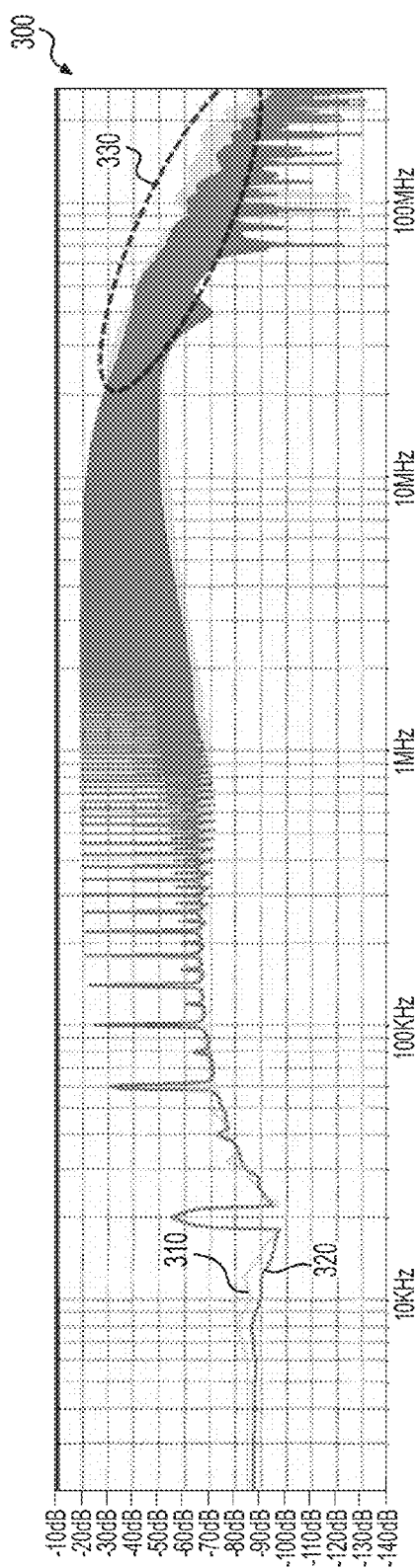
FIGS. 3 and 4 show plots of simulation results according to an embodiment of the disclosure.
Figure 4:
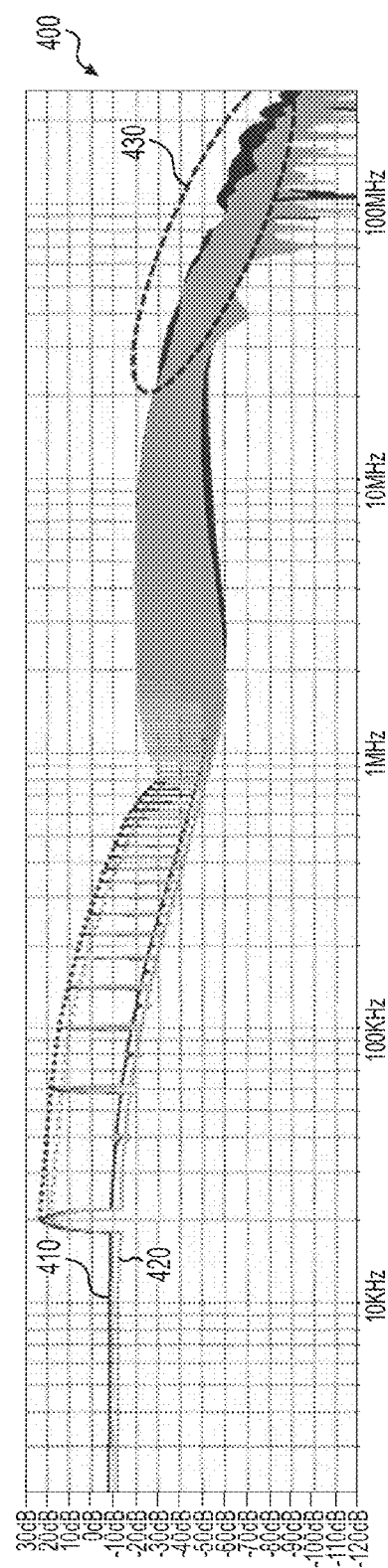

FIGS. 3 and 4 show plots of simulation results to compare the system 100 with a comparison example. The comparison example uses a single P-type MOSFET in the place of the pull-up circuit 141 to provide the pull up current to the N-type MOSFET Q1. In the simulation, the N-type MOSFET Q1 is a SiC MOSFET.

FIG. 3 shows a plot 300 of common mode EMI noise spectrums for the system 100 and the comparison example. The plot includes a first spectrum 310 (in light grey) for the comparison example, and a second spectrum 320 (in grey) for the system 100. As seen in FIG. 3, the second spectrum 320 has significant lower common mode EMI noise in the high frequency region, such as 20 MHz to 200 MHz, and the like, than the first spectrum 310, as shown by 330.

FIG. 4 shows a plot 400 of differential mode EMI noise spectrums for the driver circuit 140 and the comparison example. The plot includes a first spectrum 410 (in dark grey) for the comparison example, and a second spectrum 420 (in grey) for the system 100. As seen in FIG. 4, the second spectrum 420 has significant lower differential mode EMI noise in the high frequency region, such as 20 MHz to 200 MHz, and the like than the first spectrum 410, as shown by 430.

According to an aspect of the disclosure, the driver circuit 140 provides the pull-up current in the ramping characteristic, and less harmonics of the gate current are injected into the system; therefore, ringing and surges can be reduced, and the EMI noises can be reduced. In an example, due to the lower EMI noises, system designers are relieved from the need to design strong EMI filters.

In addition, in the simulation, the N-type MOSFET Q1 has less switching loss when driven by the driver circuit 140.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
   a first circuit configured to provide a charging current to charge a control terminal of a power switch;
   a second circuit configured to provide a discharging current to discharge the control terminal of the power switch;
   an inductive component coupled to the control terminal of the power switch and directly grounded; and
   a control circuit configured to provide control signals to the first circuit and the second circuit to activate/deactivate the first circuit and the second circuit, at least one of the charging current and the discharging current ramping from a first level to a second level at a rate.

2. The circuit of claim 1, wherein the first circuit is configured to provide a pull-up current to pull up a voltage at a gate terminal of a metal-oxide-semiconductor field effect transistor (MOSFET) in the power switch to turn on the MOSFET.

3. The circuit of claim 2, wherein the power switch is implemented using a silicon carbide MOSFET.

4. The circuit of claim 1, wherein the first circuit is configured to provide a pull-up current ramping up from the first level to the second level at the rate as a function of an inductance of the inductive component.

5. The circuit of claim 4, wherein the first circuit includes a current mirror configured to mirror a current flowing through the inductive component to generate the pull-up current.

6. The circuit of claim 5, wherein the first circuit includes a switch configured to couple the inductive component to the current mirror in response to one of the control signals from the control circuit.

7. The circuit of claim 6, wherein the first circuit includes a diode configured to conduct a freewheel current of the inductive component when the inductive component is decoupled from the current mirror.

8. A method for driving a power switch, comprising:
   activating a first circuit configured to provide a charging current to charge a control terminal of the power switch;
   generating, by the first circuit, a current ramping from a first level to a second level at a rate as a function of an inductive component coupled to the control terminal of the power switch and directly grounded; and
   providing the current to a control terminal of the power switch to turn on/off the power switch.

9. The method of claim 8, wherein providing the current to the control terminal of the power switch to turn on/off the power switch further comprises:
   providing the current to a gate terminal of a metal-oxide-semiconductor field effect transistor (MOSFET) in the power switch to turn on the MOSFET.

10. The method of claim 9, wherein:
    providing the current to the gate terminal of a silicon carbide MOSFET to turn on the silicon carbide MOSFET.

11. The method of claim 8, wherein generating, by the first circuit, the current ramping from the first level to the second level at the rate further comprises:
    generating a pull-up current ramping up from the first level to the second level at the rate as a function of an inductance of the inductive component.

12. The method of claim 11, wherein generating the pull-up current ramping up from the first level to the second level at the rate as the function of the inductance of the inductive component further comprises:
    mirroring a current flowing through the inductive component to generate the pull-up current.

13. The method of claim 12, wherein mirroring the current flowing through the inductive component to generate the pull-up current further comprises:
    coupling the inductive component to a current mirror to flow the current in the inductive component;
    decoupling the inductive component from the current mirror; and
    flowing a freewheel current of the inductive component via a diode.

14. An apparatus, comprising:
    a power switch configured to be turned on/off by a driver circuit; and
    the driver circuit comprising:
      a first circuit configured to provide a charging current to charge a control terminal of the power switch;
      a second circuit configured to provide a discharging current to discharge the control terminal of the power switch;
      an inductive component coupled to the control terminal of the power switch and directly grounded; and
      a control circuit configured to provide control signals to the first circuit and the second circuit to activate/deactivate the first circuit and the second circuit, at least one of the charging current and the discharging current ramping from a first level to a second level at a rate.

15. The apparatus of claim 14, wherein the power switch includes a metal-oxide-semiconductor field effect transistor (MOSFET), and the first circuit is configured to provide a pull-up current to pull up a voltage at a gate terminal of the MOSFET to turn on the MOSFET.

16. The apparatus of claim 15, wherein the power switch is implemented using a silicon carbide MOSFET.

17. The apparatus of claim 14, wherein the first circuit comprises the inductive component having an inductance, and the rate is a function of the inductance.

18. The apparatus of claim 17, wherein the first circuit includes a current mirror configured to mirror a current flowing through the inductive component to generate a pull-up current.

19. The apparatus of claim 18, wherein the first circuit includes a switch configured to couple the inductive component to the current mirror in response to one of the control signals from the control circuit.

20. The apparatus of claim 19, wherein the first circuit includes a diode configured to conduct a freewheel current of the inductive component when the inductive component is de-coupled from the current mirror.

\* \* \* \* \*